United States Patent [19]
Jones

[11] Patent Number: 5,677,648
[45] Date of Patent: Oct. 14, 1997

[54] NOISE COMPENSATED PHASE LOCKED LOOP CIRCUIT

[75] Inventor: Anthony Mark Jones, Bristol, United Kingdom

[73] Assignee: Discovision Associates, Irvine, Calif.

[21] Appl. No.: 396,834

[22] Filed: Mar. 1, 1995

[30] Foreign Application Priority Data

Mar. 24, 1994 [GB] United Kingdom .................. 9405805

[51] Int. Cl.⁶ .................................................. H03L 7/085
[52] U.S. Cl. ........................ 331/17; 331/14; 331/1 A; 331/DIG. 2; 327/157; 327/159
[58] Field of Search .................................. 327/157, 159, 327/150, 156; 331/17, DIG. 2, 1 A, 14; 375/376

[56] References Cited

U.S. PATENT DOCUMENTS

| | | | |
|---|---|---|---|
| 3,893,042 | 7/1975 | Whitman et al. | 331/55 |
| 4,339,731 | 7/1982 | Adams | 331/1 A |
| 4,433,308 | 2/1984 | Hirata | 331/17 |
| 4,437,072 | 3/1984 | Asami | 331/1 A |
| 4,712,077 | 12/1987 | Ansell et al. | 331/25 |
| 4,940,951 | 7/1990 | Sakamoto | 331/4 |
| 5,057,793 | 10/1991 | Cowley et al. | 331/1 A |
| 5,250,913 | 10/1993 | Gleichert et al. | 331/25 |
| 5,258,725 | 11/1993 | Kinoshita | 331/17 |
| 5,278,520 | 1/1994 | Parker et al. | 331/1 A |
| 5,294,894 | 3/1994 | Gebara | 331/1 A |
| 5,304,953 | 4/1994 | Heim et al. | 331/1 A |
| 5,341,405 | 8/1994 | Mallard, Jr. | 375/376 |
| 5,343,167 | 8/1994 | Masumoto et al. | 331/2 |
| 5,422,603 | 6/1995 | Soyuer | 331/1 A |

FOREIGN PATENT DOCUMENTS

| | | | |
|---|---|---|---|
| 206816 | 12/1986 | European Pat. Off. | H03L 7/08 |
| 3218363 | 11/1983 | Germany | H03L 7/06 |
| 0148411 | 11/1979 | Japan | 331/DIG. 2 |
| 900310728 | 6/1992 | Japan | H03K 5/26 |

OTHER PUBLICATIONS

IBM Technical Disclosure Bulletin, "Differential Charge Pump", vol. 33, No. 9 —Feb. 1991 pp. 332–333.

*Primary Examiner*—Robert Pascal
*Assistant Examiner*—Arnold Kinkead
*Attorney, Agent, or Firm*—Ronald J. Clark; Robert T. Braun; Arthur S. Bickel

[57] ABSTRACT

An improved phase locked loop utilizing control logic generated by a phase detector to eliminate sensitivity to uncorrelated noise when the loop is in lock.

9 Claims, 3 Drawing Sheets

NOISE COMPENSATED PHASE LOCKED LOOP CIRCUIT

BACKGROUND OF THE INVENTION

A Phase Locked Loop (PLL) is commonly used to synthesize an output frequency by synchronizing an input signal, known as the reference signal, with an internal oscillator. A PLL commonly consists of a phase detector, a filter and a reference oscillator. By inserting a digital divider (divide by N) in the reference signal path and another digital divider (divide by M) in the oscillator output path, the oscillator output will be at the reference frequency scaled by M/N. In a simple case, where M/N is equal to one, there are no digital dividers in either path.

When the difference between the input and reference oscillator frequencies is zero, or very small, the PLL is said to be in a locked state. When there is a difference in the frequencies, either when the locked state is perturbed or when the reference input changes frequency, the PLL moves to a dynamic state in which the oscillator frequency is adjusted until the locked state is achieved once more.

The Phase Detector (PD) produces a signal indicative of the phase difference between the inputs of the PD; that is the input signal and the oscillator signal. The PD detector can be implemented in many ways, with each incarnation having unique characteristics. A very common PD circuit is a digital, phase-frequency comparator, with a three-state output. This particular type of PD is referred to as a type-II phase detector. Type-II phase detectors are used in applications where frequency lock as well as phase lock is desirable.

Type-II phase detectors are usually associated with a charge pump device, which translates the three-state output of the PD into a signal which is filtered before controlling the internal oscillator. The three output states of the PD are denoted by UP, DOWN and NEITHER. When the PD output state is UP, the charge pump allows current to flow into the input of the filter. When the PD output state is DOWN, the charge pump removes current from the input of the filter. When the PD output state is NEITHER, no current flows.

The filter in a PLL provides a voltage to the internal oscillator which affects the frequency of the oscillator. The most simple form of filter is a capacitor. The capacitor acts as an integrator, accumulating the net charge output by the charge pump circuit, resulting in a stable voltage which can be used to control an internal oscillator. Such an oscillator is known as a Voltage Controlled Oscillator (VCO).

When the PLL is in a dynamic state, the PD generates many UP, DOWN and NEITHER output states as the loop attempts to acquire lock. When the loop is in lock, the PD generates only NEITHER output, since no correction is necessary by definition. This means that in the quiescent, locked state the loop has no gain, and in particular the charge pump is not driving any current. A signal that is not driven is known as a high impedance signal, and is very susceptible to picking up all types of extraneous noise.

To overcome this weakness inherent in a PLL system, the sensitive node or nodes must be shielded from such noise. This is expensive in silicon area and is very difficult to achieve since the techniques used depend on many parameters outside the designer's control. It often takes many revisions of the silicon design to finally achieve the desired performance.

A companion technique often used to lessen the effect of the inherent variation of shielding, is the use of a differential filter. Differential filters only filter the difference between two signals. This means that if some noise couples onto both inputs in an identical manner, the difference is not changed and hence the noise has no effect. A signal that adds onto both signals which are subsequently subtracted is known as a common-mode signal, since it is common to both signals.

Differential filters are not perfect. Some of the common-mode signal will remain, although only a very small fraction of the original common-mode signal power will be evident at the output.

In a real system, most sources of noise do not couple evenly onto each of the differential signals. This effect is of particular importance when the differential inputs to the filter are not being driven, that is when the loop is in lock.

SUMMARY OF THE INVENTION

The present invention relates to a PLL using a type-II phase detector, a charge pump device, a logic circuit, a differential filter and a VCO. The PLL may also use digital dividers. The phase detector controls a logic circuit which ensures that any occurrence of uncorrelated noise, from any source, is common-mode to the inputs of the differential filter when the PLL is in a locked state.

When the PD is has NEITHER output, the inputs to the differential filter are connected via a transistor and a join line, resulting in the two inputs becoming a single node. This ensures that any noise is guaranteed to be common-mode to the filter, and as such will not affect the VCO input. If the NEITHER output is due to the PLL being in a locked state, the absence of a perturbation to the VCO input will cause the PLL to continue to operate in the locked state.

Using only a logic device and a transistor, the PLL is no longer sensitive to erroneous signals that could cause it to go into an unlocked, dynamic state from a previously locked state. This "shielding" is inexpensive because both the logic device and the transistor are already available on the integrated circuit, and no additional space or materials must be used.

Additional features of the invention will be clear to those skilled in the art.

DESCRIPTION OF THE DRAWINGS

The present invention is illustrated by way of example and not limitation in the figures of the accompanying, in which like references indicate like elements, and which.

DETAILED DESCRIPTION OF THE INVENTION

Figure 1:
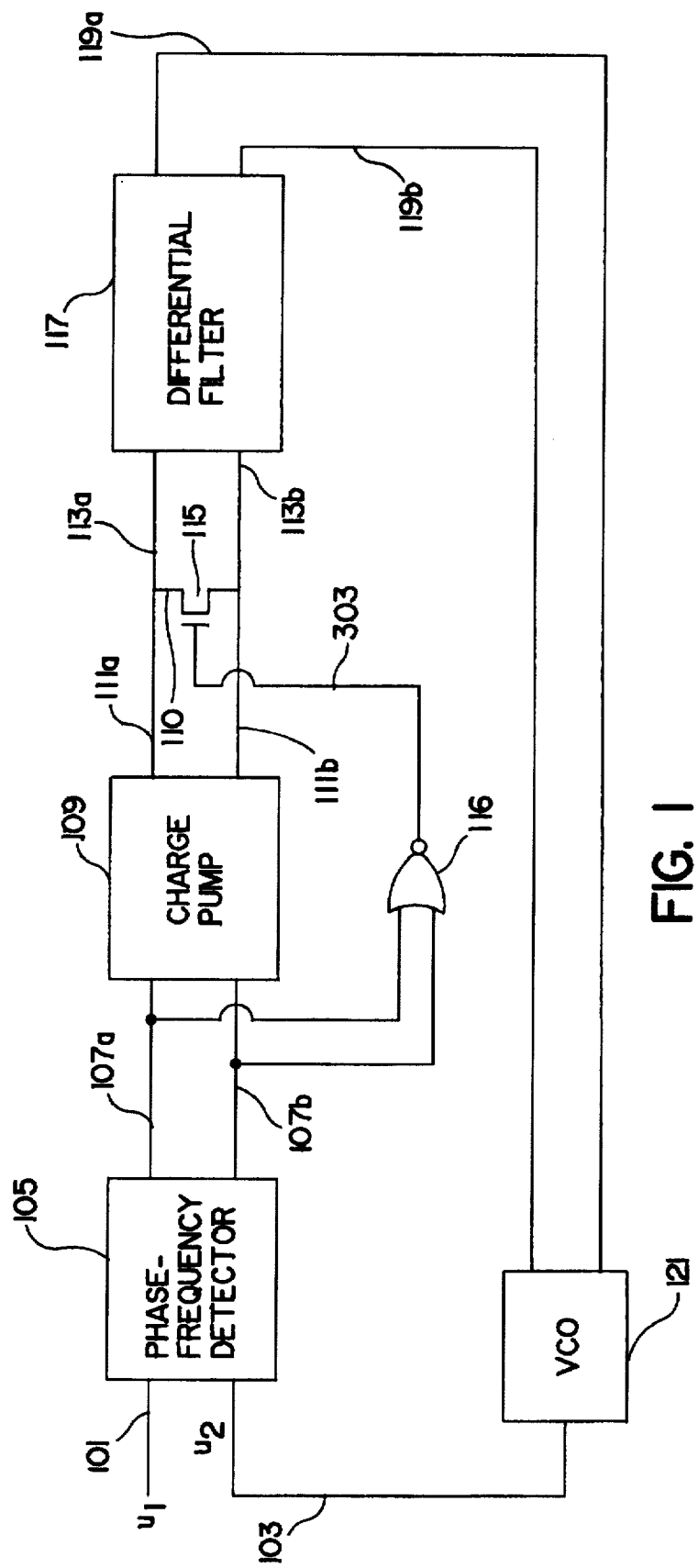
FIG. 1 shows a digital PLL including a charge pump device, embodying the present invention.

A PLL contains a minimum of three elements; a phase detector (PD), a filter and a voltage controlled oscillator (VCO). The VCO output is the internal oscillator signal being generated by the PLL, and is the signal that is compared with the input reference signal. In the embodiment shown in FIG. 1, the input signal $u_1$ and the VCO signal $u_2$ are fed into the phase-frequency detector 105 via lines 101 and 103 respectively.

The PD 105 produces a signal based on the differences between the phase and frequency of the input signal and the VCO signal. A type-II PD will produce an UP output state when the internal oscillator, the VCO, has to increase in frequency. The UP output state consists of the logic element 1 on the UP line 107a and the logic element 0 on the DOWN line 107b. A type-II PD will produce a DOWN output state when the internal oscillator has to decrease the frequency of the VCO. A DOWN output state consists of the logic element 0 on the UP line 107a and the logic element 1 on the DOWN line 107b. When there is no phase difference between the input signal and the VCO signal, the type-II PD will produce a NEITHER output state, consisting of the logic element 0 on both the UP line 107a and the DOWN line 107b.

The UP and DOWN lines 107a and 107b are then fed into a charge pump device 109. The charge pump device transforms the UP or DOWN output states into a net charge movement to or from the differential filter 117. The details of this procedure are described below. An UP or DOWN output state will result in the voltage difference between lines 111a and 111b to pass on to lines 113a and 113b respectively. If the PD output is NEITHER, then the NOR gate 116 will close transistor 115, and a join line 116 will join lines 113a and 113b, causing there to be no voltage difference between lines 113a and 113b.

This is a highly advantageous result because a NEITHER output is the output state produced by the PD when the PLL is in a locked state, that is a state where there is no phase difference between the input and the VCO. In the locked state, there should be no voltage difference between lines 113a and 113b. If there were a voltage difference, the output of differential filter 117, on lines 119a and 119b, would cause the VCO to change frequency, and undesirable perturbation when the PLL has acquired a locked state. In particular any uncorrelated noise coupling onto either line 113a or 113b will be common-mode to the filter 117 as a result of the join line 116 and transistor 115.

Transistor 115 effectively shields the circuit from uncorrelated noise coupling on to the sensitive nodes, lines 113a and 113b, by assuring that the noise is common-mode to the filter 117. The particular implementation of the filter 117 determines to what extent the common-mode noise is rejected, but in practice this rejection is high.

The source of noise can be external, for instance electromagnetic interference by radio waves, or internal, for example the coupling of other frequencies on the IC through the substrate. If no shielding were used, lines 113a and 113b would be particularly sensitive when the PLL is in the locked state, since no circuit is driving them.

Transistor 115 also causes the voltage of 113a and 113b to be half-way between a logic 1 element and a logic 0 element. On most ICs this would be at a mid-rail voltage. For all implementations of the filter 117 which include an active device (a passive differential filter would be very unusual), a common-mode signal centered at mid-rail is maximally rejected.

Note that a NEITHER output state can also occur during the dynamic period in which the PLL is attempting to lock. This NEITHER state may exist for only a short period of time, but it is also important that the differential filter not be subject to noise during that time. The transistor and the join line assure that noise does no effect the output of the differential filter when the phase detector produces a NEITHER signal.

Figure 2:
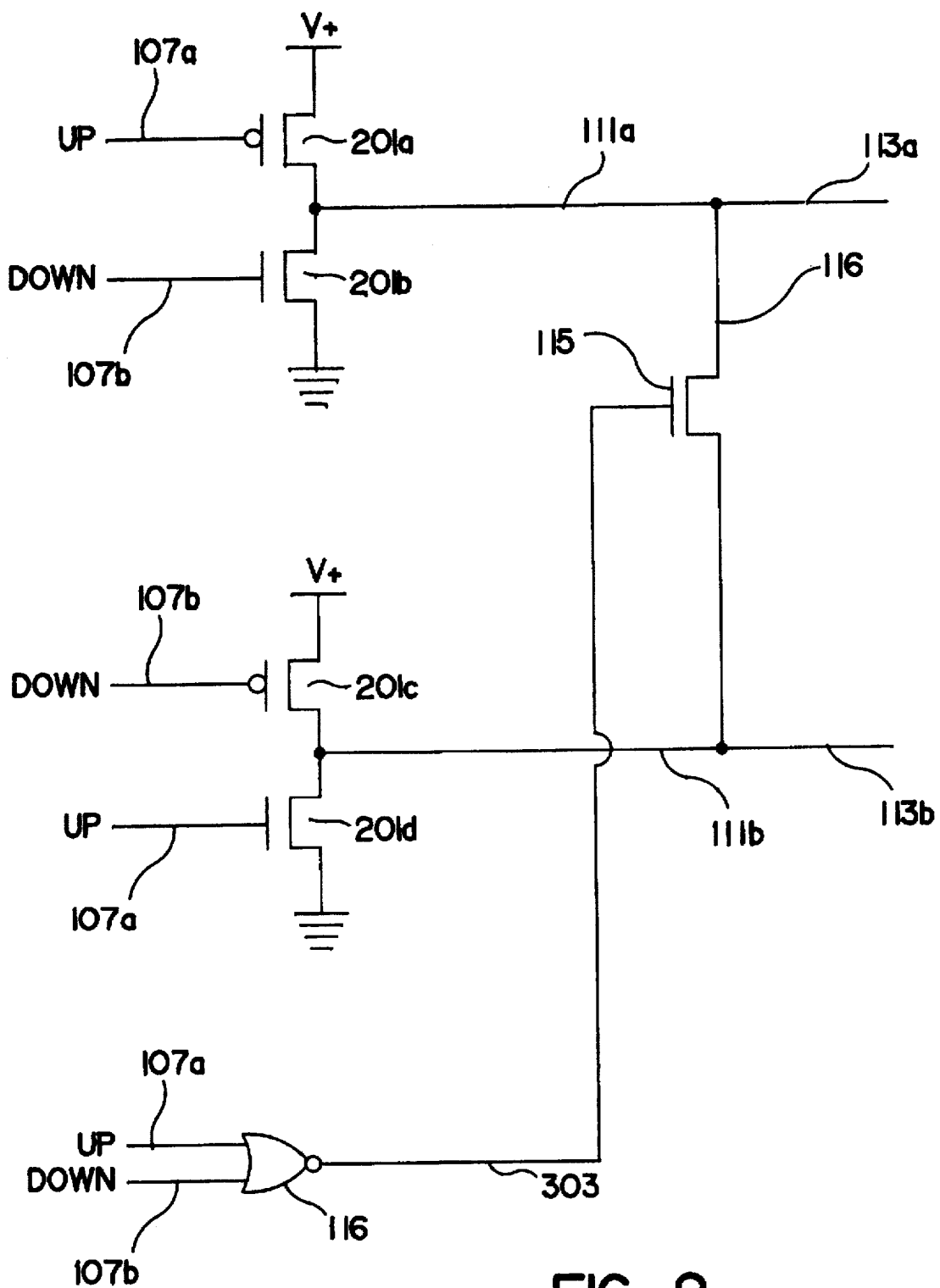
FIG. 2 shows an expanded view of the logic device controlling the charge pump device, embodying the present invention.

FIG. 2 shows the charge pump logic in more detail. The UP and DOWN lines 107a and 107b are variously applied to transistors 201a, 201b, 201c and 201d in such a way as to produce a positive voltage difference between lines 111a and 111b when the UP output state is applied, and a negative voltage difference when a DOWN output state is applied.

In particular, an UP output state, consisting of the logic element 1 on the UP line 107a and the logic element 0 on the DOWN line 107b, will result in a positive voltage being applied to line 111a by closing transistor 201a, and a zero voltage being applied to 111b by closing transistor 201d. Both transistors 201b and 201c will be open. The voltage difference is given by $$V(111a)-V(111b)=V(V+)-0=V(V+)$$

Similarly, a DOWN output state, consisting of the logic element 0 on the UP line 107a and the logic element 1 on the DOWN line 107b, will result in a positive voltage being applied to line 111b by closing transistor 201c, and a zero voltage being applied to 111a by closing transistor 201b. Both transistors 201a and 201d will be open. The voltage difference is given by $$V(111a)-V(111b)=0-V(V+)=-V(V+)$$

In both the cases of the UP output state and the DOWN output state, the output of the NOR logic element 116 is the logic element 0. The transistor 115 is therefore open and allows a voltage difference to develop between lines 113a and 113b in these output states.

When the PD has a NEITHER output state, transistor 115 is closed as a result of the logic element 0 on both the UP line 107a and the DOWN line 107b being applied to NOR gate 116. In this output state, all transistors 201a, 201b, 201c and 201d are open, so if transistor 115 were absent, there would be no drive onto either of lines 111a and 111b. Such floating lines are very susceptible to noise pick-up.

Figure 3:
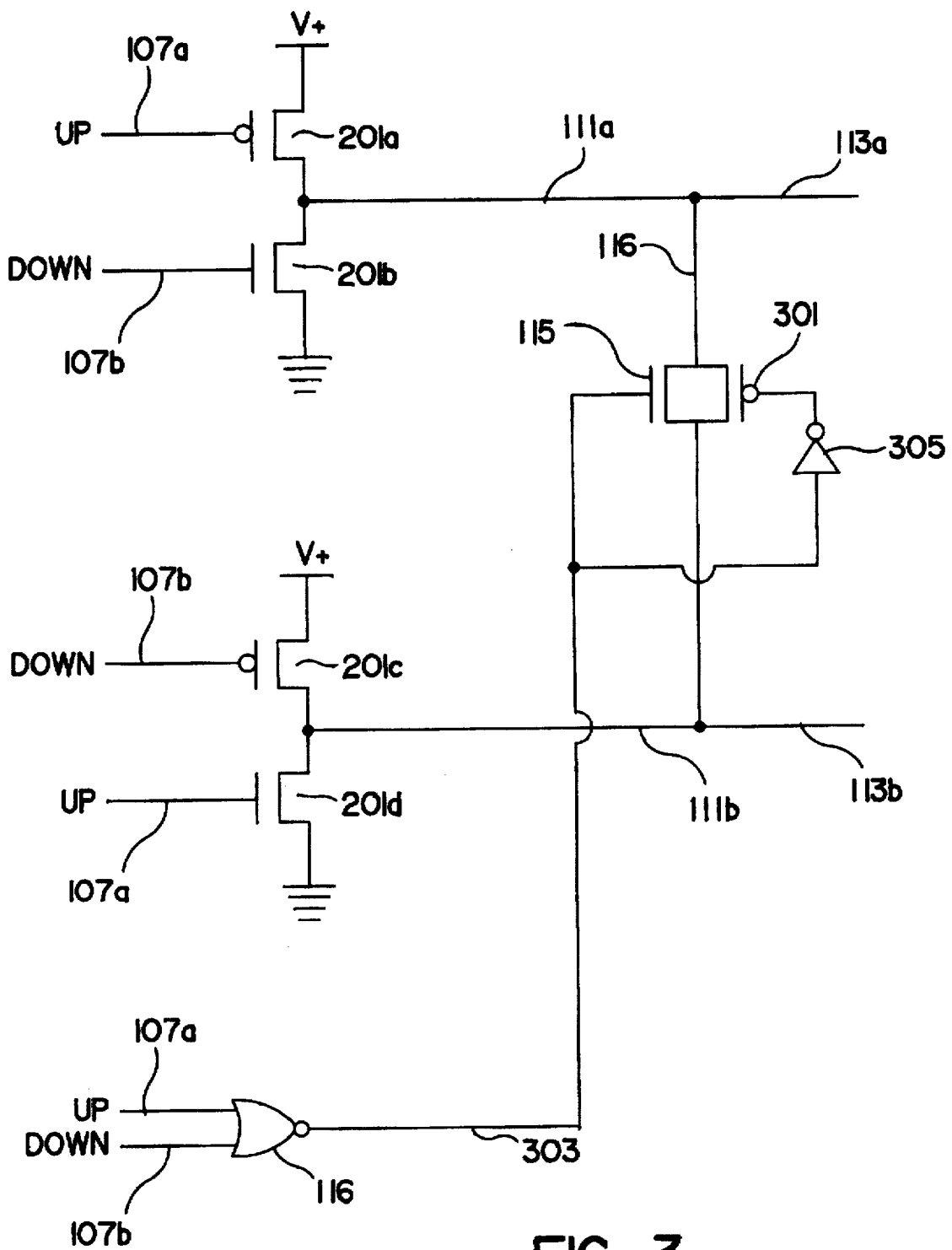
FIG. 3 shows an expanded view of an alternate embodiment of the invention.

FIG. 3 shows an alternate embodiment of the invention utilizing two transistors. The behavior of this embodiment is exactly as described above. By using a second transistor 301 it is possible to improve the noise rejection of the PLL. The improved rejection is a result of transistor 301 compensating for any switching noise that may be introduced by transistor 115 in the embodiment described in FIG. 2.

Each transistor will have a capacitance as a result of the manufacturing process. In the embodiment described in FIG. 2, this capacitors may inject current into the differential filter 117 when transistor 115 is switched into the closed state. This current is purely the result of the transition from logic element 0 to logic element 1 on line 303. The current is not necessarily common-mode, and may cause a small perturbation of the VCO inputs 119a and 119b.

By using a p-type transistor as well, the transition from logic element 0 to logic element 1 on signal 303 is matched by a inverse transition from logic element 1 to logic element 0 on signal 305. By matching the size of the stray capacitance between the n-type and p-type transistors, the net injection current will be zero.

This inventive PLL has been found to be useful in synthesizing various clock signals used to control other elements within the IC. In many control systems it is important for the clocks to be especially accurate. In particular the inventive PLL has been found to be useful in an IC used to display video signals. Further application has been found in systems requiring the synthesis of a pure frequency for later demodulation of carrier frequencies.

Thus the invention for an improved PLL circuit has been described. Although this invention has been described with particularity with reference to the preferred embodiments set forth in FIGS. 1 and 3, it will apparent to one skilled in the art that the present invention has utility far exceeding that disclosed in the figures. Additions, subtractions and other modifications of the preferred embodiment of the invention will be apparent to those skilled in the art and are within the scope of the following claims.

I claim:

1. A phase locked loop capable of operating in a dynamic and a locked state, having;

a differential filter including a first and second input lines;

a join line, connecting said first and second input lines when the phase locked loop is in a locked state, such that there is substantially no voltage difference between the first and second input lines, but not connecting said first and second input lines when the phase locked loop is in a dynamic state.

2. The phase locked loop of claim 1, wherein said join line further includes;

a transistor, operating to open the join line when the phase locked loop is in a dynamic state and closing the join line when the phase locked loop is in a locked state.

3. The phase locked loop of claim 1 further comprising;

a phase detector capable of producing at least two distinct logic signals;

wherein said join line is opened or closed according to the logic signal produced by the phase detector.

4. The phase locked loop of claim 3, wherein at least one of said distinct logic signals corresponds to ZERO phase difference being detected and said join line is closed in accordance with a NEITHER logic signal.

5. A phase locked loop, capable of operating in a dynamic and a locked state for use in a clock generating apparatus including:

a differential filter including a first and second input lines;

a join line, connecting said first and second input lines when the phase locked loop is in a locked state, such that there is substantially no voltage difference between the first and second input lines, but not connecting said first and second input lines when the phase locked loop is in a dynamic state.

6. A phase locked loop circuit, comprising:

a phase detector responsive to a phase difference between an input signal and a reference signal;

a charge pump coupled to said phase detector;

a passive differential filter having first and second inputs coupled to said charge pump;

a switch connected across said first and second inputs of said differential filter;

a control responsive to said phase detector, wherein said switch is closed when said phase difference has a substantially zero magnitude, and said switch is open when said phase difference has a magnitude which is not substantially zero; and a variable frequency generator having a frequency responsive to an output of said differential filter for generating said reference signal.

7. The circuit according to claim 6, wherein said switch comprises a transistor having a gate connected to a logic element.

8. The circuit according to claim 6, wherein said switch comprises a PNP transistor and an NPN transistor each having a gate connected to a logic element.

9. The circuit according to claim 6, wherein said variable frequency generator is a voltage controlled oscillator.

* * * * *